United States Patent
Katsui et al.

(10) Patent No.: US 8,835,928 B2
(45) Date of Patent: Sep. 16, 2014

(54) SEMICONDUCTOR DEVICE AND PROCESS FOR PRODUCTION THEREOF

(75) Inventors: Hiromitsu Katsui, Osaka (JP); Takeshi Yaneda, Osaka (JP); Yoshiyuki Isomura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/822,658

(22) PCT Filed: Sep. 13, 2011

(86) PCT No.: PCT/JP2011/070805
§ 371 (c)(1),
(2), (4) Date: Mar. 13, 2013

(87) PCT Pub. No.: WO2012/039317
PCT Pub. Date: Mar. 29, 2012

(65) Prior Publication Data
US 2013/0207115 A1    Aug. 15, 2013

(30) Foreign Application Priority Data
Sep. 21, 2010    (JP) ................... 2010-210588

(51) Int. Cl.
| | |
|---|---|
| H01L 31/00 | (2006.01) |
| H01L 27/02 | (2006.01) |
| H01L 27/12 | (2006.01) |
| H01L 29/66 | (2006.01) |
| G02F 1/1362 | (2006.01) |
| H01L 29/49 | (2006.01) |
| H01L 29/786 | (2006.01) |
| H01L 29/45 | (2006.01) |

(52) U.S. Cl.
CPC ....... *H01L 29/66742* (2013.01); *H01L 29/4908* (2013.01); *H01L 29/7869* (2013.01); *H01L 27/0296* (2013.01); *H01L 27/1288* (2013.01); *H01L 27/1214* (2013.01); *H01L 27/124* (2013.01); *H01L 29/786* (2013.01); *H01L 29/458* (2013.01); *G02F 1/136204* (2013.01)

USPC 257/59; 257/72; 257/E29.276; 257/E51.005; 438/149; 438/151

(58) Field of Classification Search
CPC .............................. H01L 27/32; H01L 29/786
USPC ...................... 257/59, 72, E29.273, E51.005; 438/149, 151
See application file for complete search history.

(56) References Cited

U.S. PATENT DOCUMENTS

| | | | | |
|---|---|---|---|---|
| 5,200,876 A | * | 4/1993 | Takeda et al. | 361/56 |
| 5,926,234 A | * | 7/1999 | Shiraki et al. | 349/40 |

(Continued)

FOREIGN PATENT DOCUMENTS

| | | |
|---|---|---|
| JP | 11-109416 A | 4/1999 |
| JP | 11-119257 A | 4/1999 |

(Continued)

OTHER PUBLICATIONS

Official Communication issued in International Patent Application No. PCT/JP2011/070805, mailed on Dec. 6, 2011.

(Continued)

*Primary Examiner* — Kenneth Parker
*Assistant Examiner* — John Lin
(74) *Attorney, Agent, or Firm* — Keating & Bennett, LLP

(57) ABSTRACT

A semiconductor device (100) according to the present invention includes a plurality of source lines (16), a thin film transistor (50A), and a diode element (10A) that electrically connects two source lines (16) among the plurality of source lines (16). A connection region (26) in which the source lines (16) and the diode element (10A) are connected to each other includes a first electrode (3), a second electrode (6a), a third electrode (9a), and a fourth electrode (9b). A part of each source line (16) is a source electrode of the thin film transistor (50A), and the second electrode (6a) and the source lines (16) are formed separately from each other.

7 Claims, 7 Drawing Sheets

(56) References Cited

U.S. PATENT DOCUMENTS

| | | | |
|---|---|---|---|
| 6,411,348 B2 * | 6/2002 | Kawai et al. | 349/40 |
| 6,762,802 B2 | 7/2004 | Ono et al. | |
| 2009/0026454 A1 | 1/2009 | Kurokawa et al. | |

FOREIGN PATENT DOCUMENTS

| JP | 2001-324725 A | 11/2001 |
|---|---|---|
| JP | 2001-330821 A | 11/2001 |
| JP | 2004-273732 A | 9/2004 |
| JP | 2004-311593 A | 11/2004 |
| JP | 2005-049738 A | 2/2005 |
| JP | 2009-049399 A | 3/2009 |

OTHER PUBLICATIONS

English translation of Official Communication issued in corresponding International Application PCT/JP2011/070805, mailed on Apr. 25, 2013.

* cited by examiner

*FIG.1*
(a)
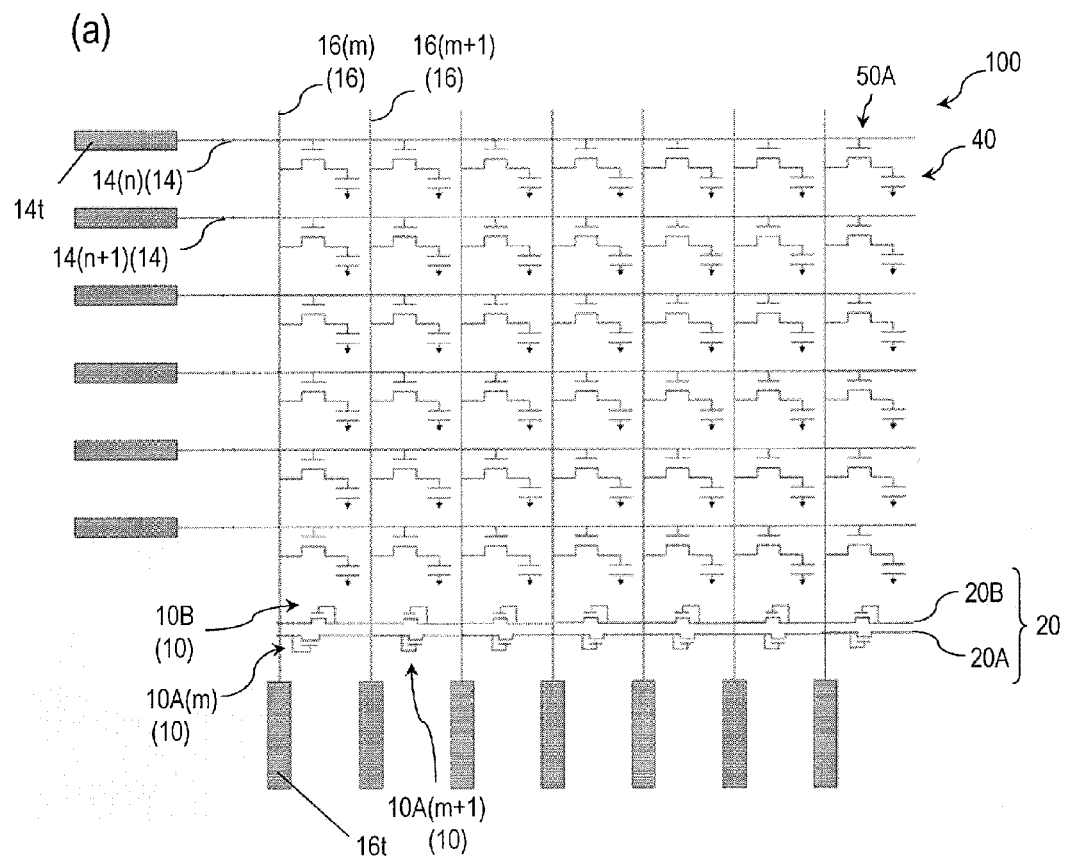
(b)
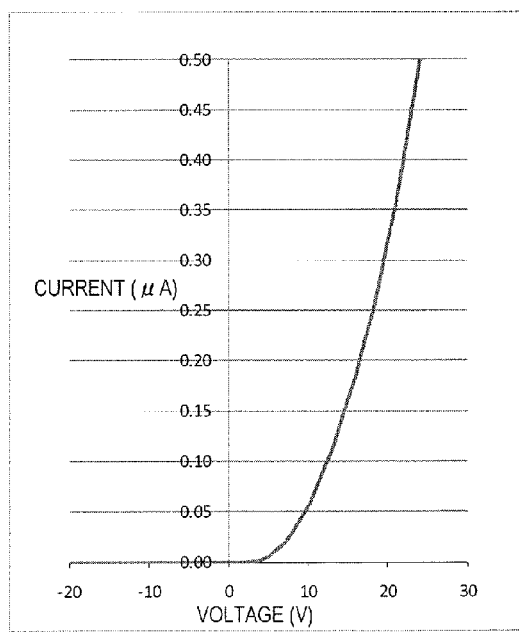

FIG.2
(a)
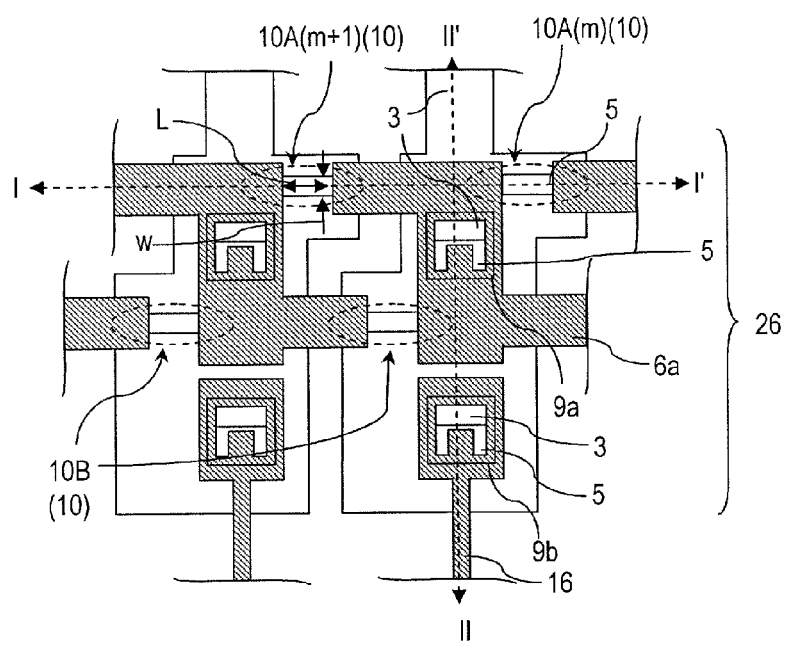
(b)
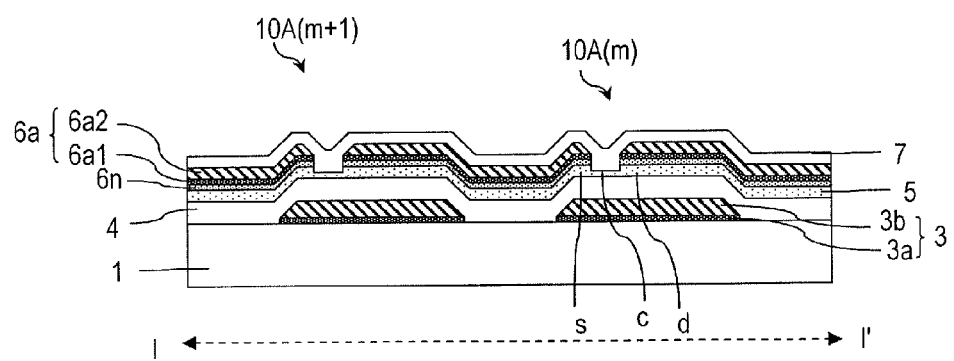
(c)
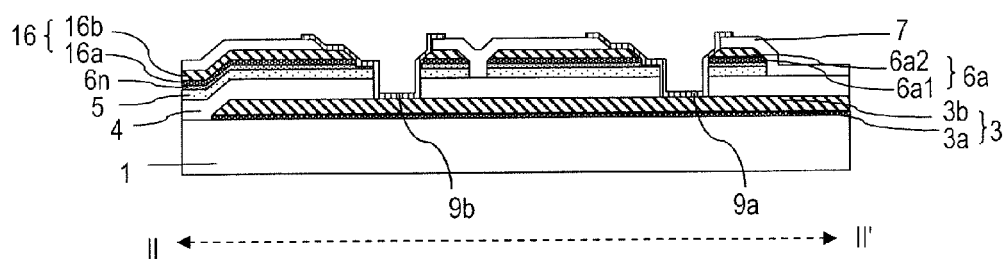

FIG.3
(a)
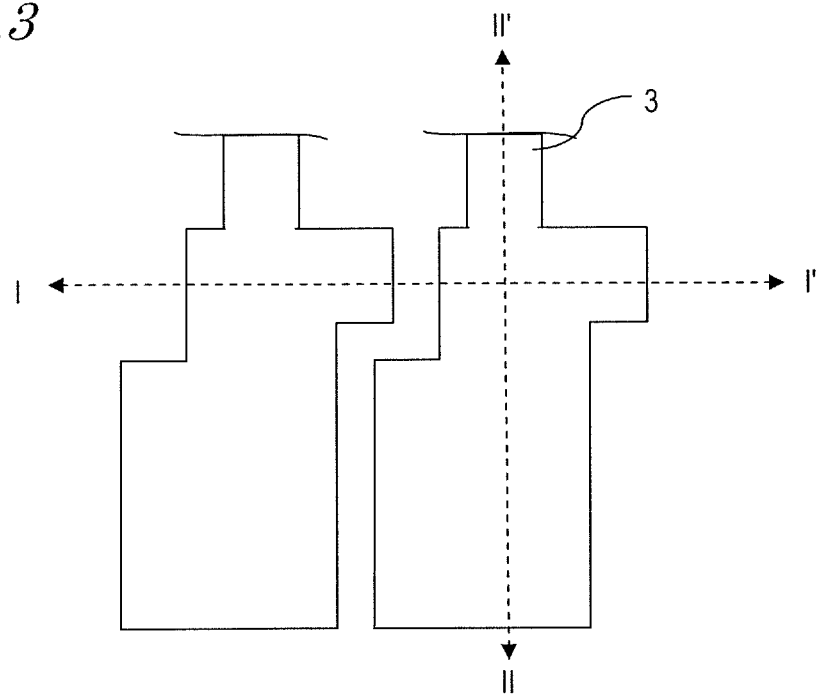
(b)
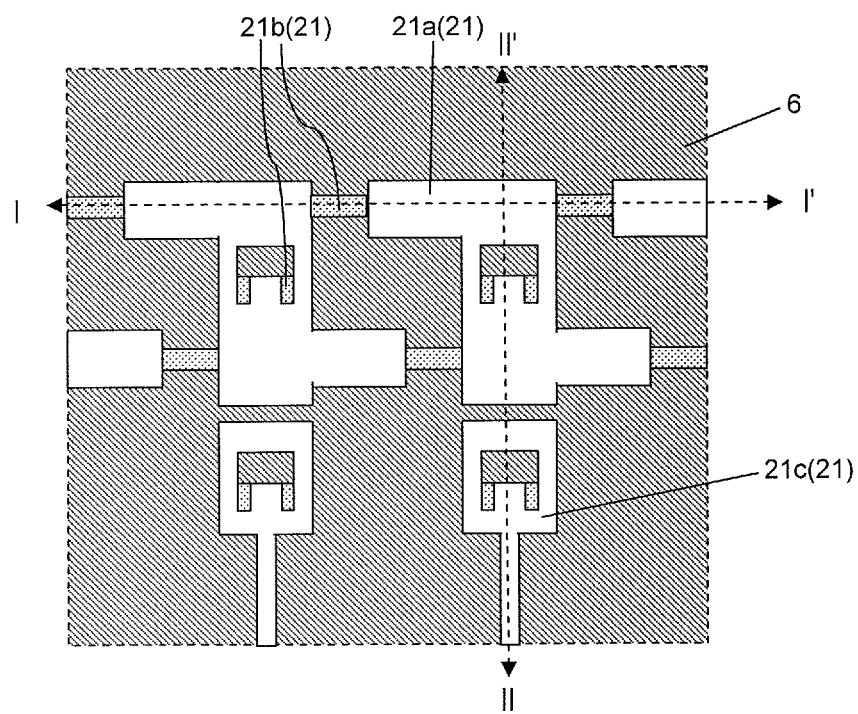

FIG.4
(a)
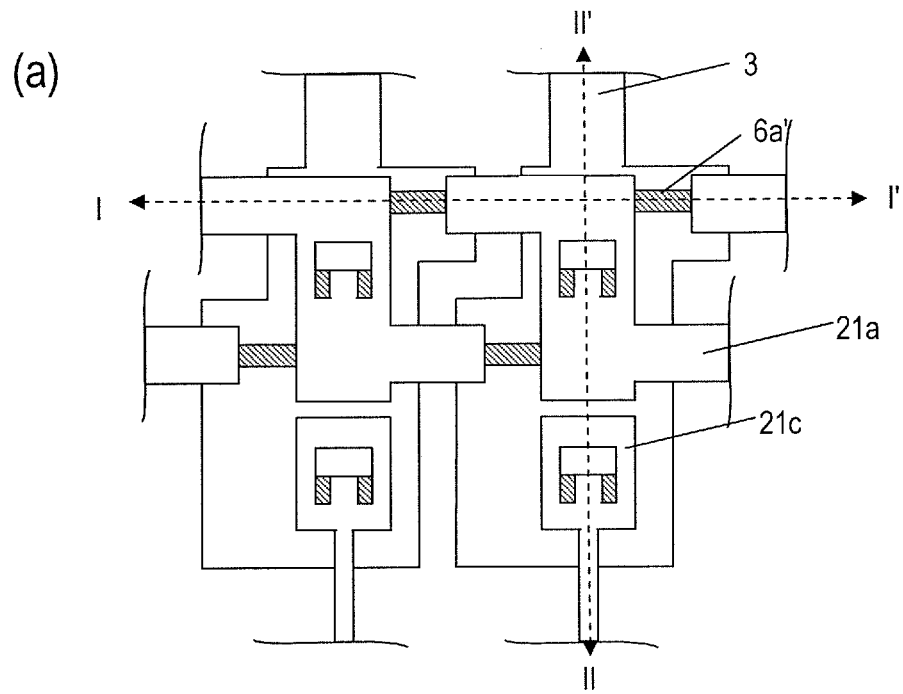
(b)
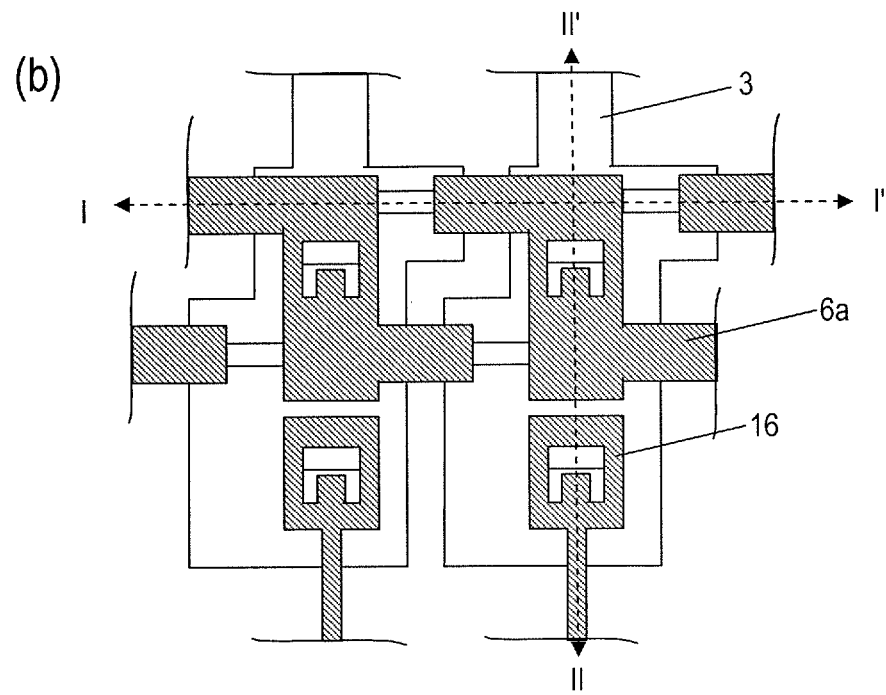

FIG.5
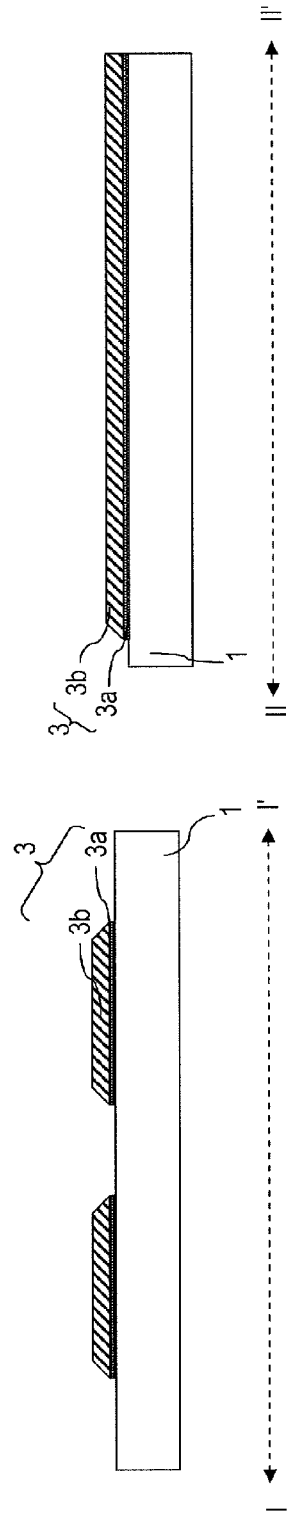
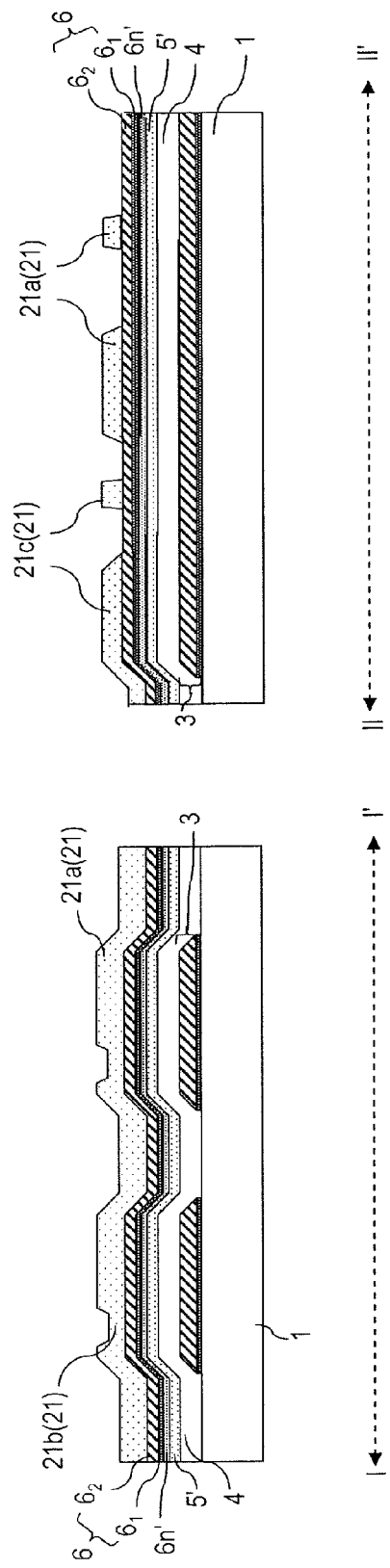

FIG. 7
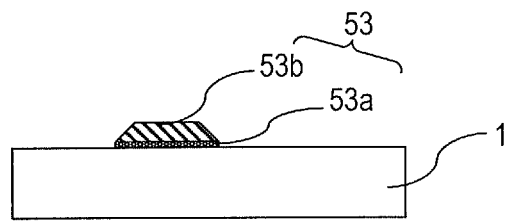
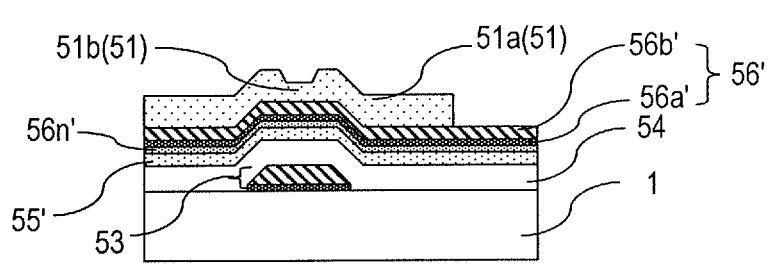
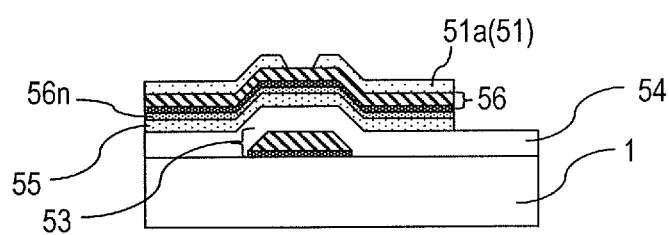
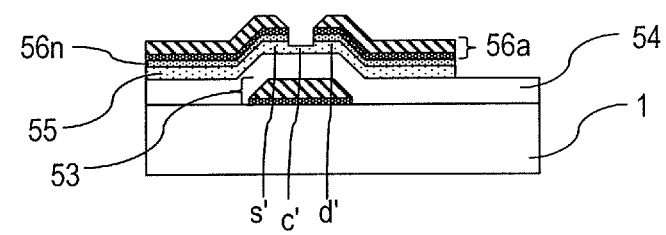
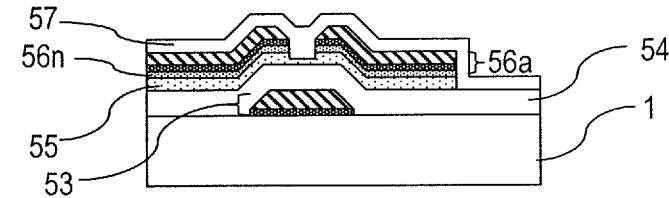

SEMICONDUCTOR DEVICE AND PROCESS FOR PRODUCTION THEREOF

TECHNICAL FIELD

The present invention relates to a semiconductor device including a thin film transistor, and a method for producing the same.

BACKGROUND ART

An active matrix liquid crystal display device includes a switching element for each pixel, and therefore can provide high-definition and high-quality display. As the switching element, a nonlinear element such as a thin film transistor (hereinafter, may be referred to as a "TFT"), a diode or the like is used. Among these elements, a TFT using amorphous silicon is widely used. In order to produce an active matrix liquid crystal display device at low cost, methods using a decreased number of photomasks (e.g., four-mask process) are now actively developed (e.g., Patent Document 1).

A production process of an active matrix liquid crystal display device usually includes many steps which are likely to cause electrostatic charges (e.g., rubbing step, etc.). However, a semiconductor device including a TFT is easily damaged by electrostatic charges. There is a problem that, for example, the electrostatic charges generated in a production process of a liquid crystal display device changes the TFT characteristic or causes electrostatic destruction, which reduces the yield.

In such a situation, active matrix substrates including various protection measures for preventing damage from being caused by electrostatic charges generated in a production process of a liquid crystal display device have been proposed or adopted (e.g., Patent Documents 2 through 4).

CITATION LIST

Patent Literature

Patent Document 1: Japanese Laid-Open Patent Publication No. 2001-324725
Patent Document 2: Japanese Laid-Open Patent Publication No. 11-109416
Patent Document 3: Japanese Laid-Open Patent Publication No. 2005-49738
Patent Document 4: Japanese Laid-Open Patent Publication No. 2004-273732

SUMMARY OF INVENTION

Technical Problem

Nonetheless, for the production methods using a decreased number of photomasks, by which an active matrix liquid crystal display device can be produced at low cost, protection measures for sufficiently preventing damage from being caused by electrostatic charges are not taken. This problem is common to methods for producing a semiconductor device by which a TFT is formed on an insulating substrate.

The present invention made in light of the above-described problem has an object of providing a method for producing a semiconductor device, which can prevent the semiconductor device from being damaged by electrostatic charges even with a decreased number of photomasks, and a semiconductor device produced by such a method.

Solution to Problem

A semiconductor device according to the present invention includes an insulating substrate; a plurality of source lines provided on the insulating substrate; a thin film transistor electrically connected to each of the plurality of source lines; a pixel electrode electrically connected to the thin film transistor; and a diode element that electrically connects two source lines among the plurality of source lines. A semiconductor layer of the diode element includes a first region, a second region and a channel region located between the first region and the second region; a connection region in which the source lines and the diode element are connected to each other includes a first electrode formed of a conductive film which is the same as that of a gate electrode of the thin film transistor; a second electrode formed of a conductive film which is the same as that of the source line; and a third electrode and a fourth electrode formed of a conductive film which is the same as that of the pixel electrode; a part of each source line is a source electrode of the thin film transistor, and the second electrode and the source lines are formed separately from each other; the first electrode and the second electrode are electrically connected to each other via the third electrode; and the first electrode and the corresponding source line are electrically connected to each other via the fourth electrode.

In one embodiment, the first region is electrically connected to the second electrode corresponding to any one of the plurality of source electrodes; and the second region is electrically connected to the second electrode corresponding to another one of the plurality of source electrodes.

In one embodiment, a plurality of the diodes elements are electrically connected parallel in opposite directions to each other.

In one embodiment, the semiconductor device further includes a color filter.

A method for producing a semiconductor device according to the present invention is a method for producing the above-described semiconductor device. The method includes step (A) of forming the first electrode on the insulating substrate; step (B) of forming an insulating layer on the first electrode; step (C) of forming the semiconductor layer on the insulating layer; step (D) of forming a metal layer and the source lines on the semiconductor layer such that the metal layer and the source lines are not electrically connected to each other; step (E) of removing a part of the metal layer which overlaps a region that is to be the channel region of the semiconductor layer of the diode element, thereby forming the second electrode; and step (F) of forming the third electrode that electrically connects the first electrode and the second electrode to each other, and forming the fourth electrode that electrically connects the first electrode and the corresponding source line to each other.

In one embodiment, the step (D) includes step (D1) of forming a photoresist layer on the metal layer such that a first part of the photoresist layer which overlaps the region that is to be the channel region of the diode element has a thickness smaller than the thickness of a second part of the photoresist layer which overlaps a region that is to be the first region of the diode element.

In one embodiment, the step (E) includes step (E1) of removing the first part.

Advantageous Effects of Invention

The present invention provides a method for producing a semiconductor device, which can prevent the semiconductor device from being damaged by electrostatic charges even with a decreased number of photomasks, and a semiconductor device produced by such a method.

BRIEF DESCRIPTION OF DRAWINGS

FIG. 1(a) is an equivalent circuit diagram of a semiconductor device 100 in an embodiment according to the present invention; and FIG. 1(b) is a graph showing the voltage-current characteristic of a diode element 10A.

FIG. 2(a) is a schematic plan view of the diode elements 10A, source lines 16 and connection regions 26; FIG. 2(b) is a schematic cross-sectional view taken along line I-I' in FIG. 2(a); and FIG. 2(c) is a schematic cross-sectional view taken along line II-II' in FIG. 2(a).

FIGS. 3(a) and 3(b) are schematic plan views illustrating a production process of the diode element 10A.

FIGS. 4(a) and 4(b) are schematic plan views illustrating the production process of the diode element 10A.

FIGS. 5(a) and 5(b) are respectively schematic cross-sectional views taken along line I-I' in FIGS. 3(a) and 3(b); and FIGS. 5(c) and 5(d) are respectively schematic cross-sectional views taken along line II-II' in FIGS. 3(a) and 3(b).

FIGS. 7(a) through 7(e) are schematic cross-sectional views illustrating a production process of a thin film transistor 50A included in the semiconductor device 100.

DESCRIPTION OF EMBODIMENTS

Figure 6:
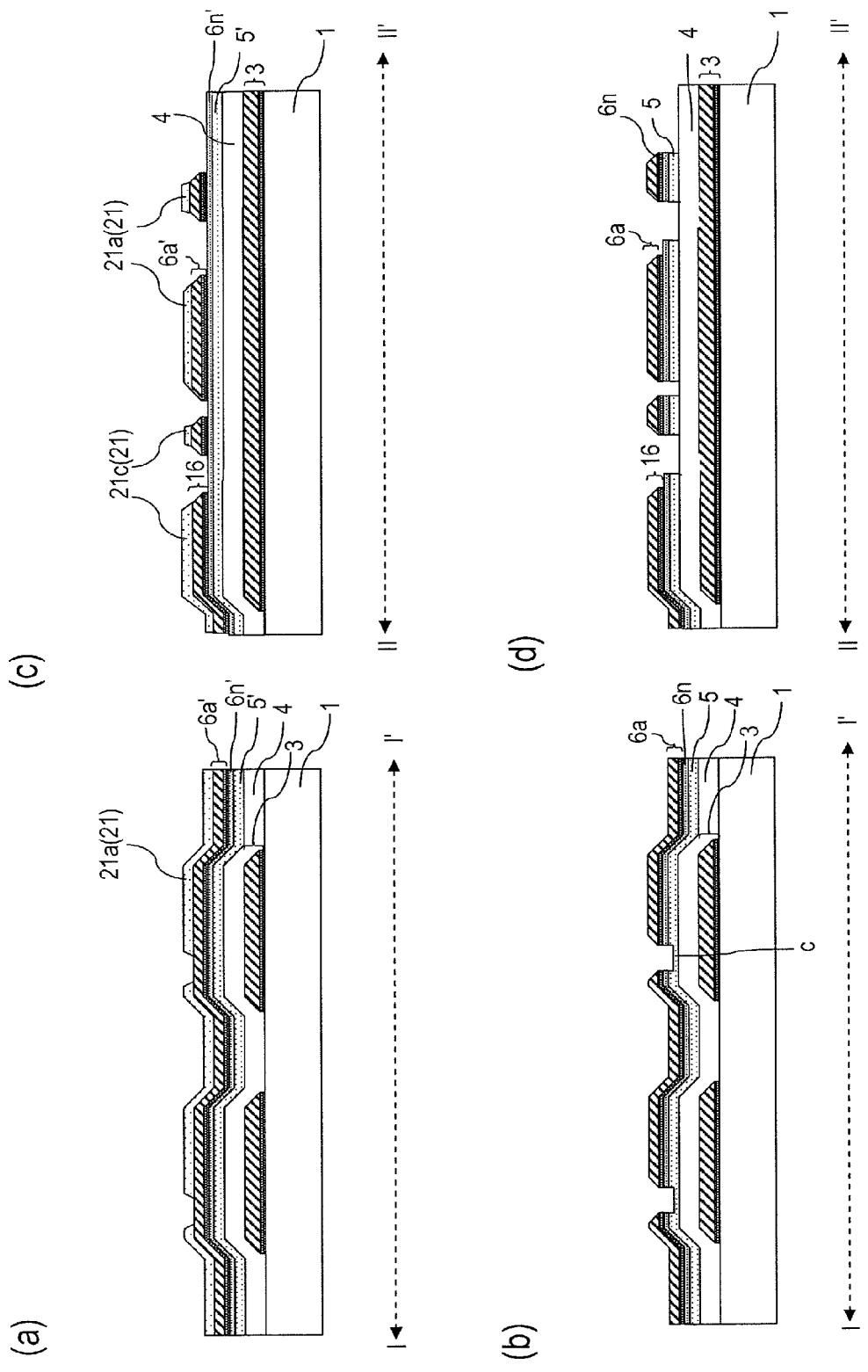
FIGS. 6(a) and 6(b) are respectively schematic cross-sectional views taken along line I-I' in FIGS. 4(a) and 4(b)
FIGS. 6(c) and 6(d) are respectively schematic cross-sectional views taken along line II-II' in FIGS. 4(a) and 4(b).

Hereinafter, a method for producing a semiconductor device and a structure of a semiconductor device produced by such a method (herein, a TFT substrate) in an embodiment according to the present invention will be described with reference to the drawings. The TFT substrate in this embodiment encompasses a TFT substrate of any of various types of display devices (e.g., liquid crystal display device or EL display device).

Herein, a TFT substrate of a liquid crystal display device and a method for producing the same will be described.

Hereinafter, with reference to FIG. 1 and FIG. 2, a semiconductor device 100 in an embodiment according to the present invention will be described.

FIG. 1(a) is an equivalent circuit diagram of the semiconductor device 100. FIG. 1(b) is a graph showing the voltage (V)-current (I) characteristic of a diode element 10A (and a diode element 10B). The semiconductor device 100 includes a plurality of gate lines 14 arranged parallel to each other, a plurality of source lines 16 perpendicular to the gate lines 14, a pixel electrode (not shown) provided in each of square or rectangular areas surrounded by the gate lines 14 and the source lines 16, and a thin film transistor 50A located in the vicinity of each of intersections of the gate lines 14 and the source lines 16. The gate lines 14 and the source lines 16 are each electrically connected to the corresponding thin film transistor 50A. The gate lines 14 are each electrically connected to a gate terminal 14t, and the source lines 16 are each electrically connected to a source terminal 16t. The gate terminals 14t and the source terminals 16t are each electrically connected to an external line (not shown). Each thin film transistor 50A is electrically connected to the corresponding pixel electrode, and acts as a switching element for applying a voltage to a liquid crystal layer 40 in a corresponding pixel.

Between two adjacent source lines (e.g., source lines 16(m) and 16(m+1)), the diode elements 10A and 10B are formed. The diode elements 10A and 10B each have a semiconductor layer formed of a semiconductor film which is the same as that of a semiconductor layer of the thin film transistor 50A. The diode elements 10A and 10B are each provided for forming a shortcircuit ring. A region in which the source lines 16 and the diode elements 10A and 10B are electrically connected to each other is referred to as a "connection region" 26 (see FIG. 2). Each of the diode elements 10A and 10B shown as examples herein has a structure obtained as a result of shortcircuiting a source electrode and a gate electrode of a TFT, and is also referred to as a "TFT-type diode".

In the diode elements 10A and 10B, the current flows in opposite directions to each other. For example, the diode element 10A(m) causes a current to flow from the source line 16(m) to the source line 16(m+1), whereas the diode element 10B(m) causes a current to flow from the source line 16(m+1) to the source line 16(m). As shown herein, a diode element 10A and a diode element 10B are connected parallel between each two adjacent source lines, and thus a shortcircuit ring 20A formed of the diode element 10A and a shortcircuit ring 20B formed of the diode element 10B are provided. The shortcircuit ring 20A and the shortcircuit ring 20B form a shortcircuit ring 20. The shortcircuit ring 20 can cause a current to flow in both directions (diffuse the charges).

The graph in FIG. 1(b) shows the voltage (V)-current (I) characteristic of the diode element 10A (and the diode element 10B) under the conditions of: the channel length L of the diode element 10A (and the diode element 10B)=30 µm and the channel width W of the diode element 10A (and the diode element 10B)=10 µm. The channel length L and the channel width W of the diode element 10A (and the diode element 10B) are not limited to these values and may be appropriately changed in accordance with the required characteristic.

As shown in FIG. 1(b), the varistor voltage of the diode element 10A (and the diode element 10B) is 7 V or higher and 10 V or lower. When a voltage equal to or lower than the varistor voltage is applied to the semiconductor layer of the diode element 10A (and the diode element 10B), no current flows in the diode element 10A (and the diode element 10B). Therefore, the source line 16(m) and the source line 16(m+1) are insulated from each other. When a voltage exceeding the varistor voltage is applied to the semiconductor layer of the diode element 10A (and the diode element 10B), a current flows in the diode element 10A (and the diode element 10B). Therefore, the source line 16(m) and the source line 16(m+1) are electrically connected to each other.

Alternatively, although not shown, a diode for forming a shortcircuit ring may be formed between two adjacent gate lines (e.g., gate line 14(n) and gate line 14(n+1)). Still alternatively, a diode for forming a shortcircuit ring may be formed between a gate line 14 and a source line 16 so that a shortcircuit ring for the source line and a shortcircuit ring for the gate line can be connected to each other.

In the semiconductor device 100, when electrostatic charges are input to any source line 16 (or/and any gate line 14) from an external device, gates of the diode elements 10A and 10B electrically connected to the source line 16 (or/and the gate line 14) are opened and the charges are diffused toward the adjacent source lines 16 (or/and the adjacent gate lines 14) sequentially. As a result, all the source lines 16 (or/and all the gate lines 14) have an equal potential. Therefore, the thin film transistors 50A are suppressed from being damaged by the electrostatic charges.

FIG. 2 provides schematic views illustrating the TFT-type diode elements 10A for forming shortcircuit rings, the source lines 16 and the connection regions 26. FIG. 2(a) is a schematic plan view illustrating the diode elements 10A, the source lines 16 and the connection regions 26. FIG. 2(b) is a schematic cross-sectional view taken along line I-I' in FIG. 2(a). FIG. 2(c) is a schematic cross-sectional view taken along line II-II' in FIG. 2(a). The diode element 10B has substantially the same structure as that of the diode element 10A and will not be described.

As shown in FIGS. 2(a) through 2(c), each connection region 26 includes a first electrode 3 provided on an insulating substrate 1 and formed of a conductive film which is the same as that of a gate electrode of the thin film transistor 50A (not shown), a first insulating layer 4 provided on the first electrode 3, a semiconductor layer 5 provided on the first insulating layer 4 and formed of a semiconductor film which is the same as that of the semiconductor layer of the thin film transistor 50A, a contact layer 6n provided on the semiconductor layer 5 and formed of a contact film which is the same as that of a contact layer of the thin film transistor 50A, the source lines 16 and a second electrode 6a provided on the contact layer 6n and formed of a conductive film which is the same as that of a source electrode of the thin film transistor 50A, and a third electrode 9a and a fourth electrode 9b formed of a conductive film (e.g., ITO (Indium Tin Oxide) film) which is the same as that of the pixel electrode (not shown). A part of each source line 16 is the source electrode of the thin film transistor 50A, and the source lines 16 and the second electrode 6a are separately formed. The first electrode 3 and the second electrode 6a are electrically connected to each other via the third electrode 9a, and the first electrode 3 and the corresponding source line 16 are electrically connected to each other via the fourth electrode 9b. The third electrode 9a and the fourth electrode 9b are separately formed in this example, but these electrodes do not absolutely need to be separated. When the third electrode 9a and the fourth electrode 9b are connected to each other, there is redundancy in connection of lines.

As shown in FIGS. 2(a) and 2(b), the diode element 10A includes the first electrode 3, the first insulating layer 4 provided on the first electrode 3, the semiconductor layer 5 provided on the first insulating layer 4, the contact layer 6n provided on the semiconductor layer 5, the second electrode 6a provided on the contact layer 6n, and a second insulating layer 7 provided on the second electrode 6a. The semiconductor layer 5 includes a first region s, a second region d, and a channel region c located between the first region s and the second region d. The first region s is electrically connected to the second electrode 6a corresponding to any one of the plurality of source lines 16, and the second region d is electrically connected to the second electrode 6a corresponding to another one of the plurality of source lines 16. On the second insulating layer 7, a photosensitive organic insulating layer, for example, may be formed.

The channel length L of the diode element 10A is, for example, 30 μm, and the channel width W of the diode element 10A is, for example, 10 μm. The channel length L is preferably in the range of, for example, 10 μm or longer and 50 μm or shorter. The channel width W is preferably in the range of, for example, 5 μm or longer and 20 μm or shorter. With such values of the channel length L and the channel width W, the diode element 10A acts as a diode element for forming a shortcircuit ring which has the above-described characteristic.

Owing to such a structure, the semiconductor device 100 is prevented from being damaged by electrostatic charges while being produced by a production method described later with a decreased number of photomasks. In addition, an inspection device described later for detecting line disconnection is prevented from making incorrect detection.

The first electrode 3, the source lines 16 and the second electrode 6a each have a stacking structure as follows. For example, bottom layers 3a, 16a and 6a1 are formed of Ti (titanium), and top layers 3b, 16b and 6a2 are formed of Cu (copper). The bottom layers 3a, 16a and 6a1 each have a thickness of, for example, 30 nm to 150 nm. The top layers 3b, 16b and 6a2 each have a thickness of, for example, 200 nm to 500 nm. The top layers 3b, 16b and 6a2 may be formed of, for example, Al (aluminum) instead of Cu. Alternatively, the first electrode 3, the source lines 16 and the second electrode 6a may each have a single layer structure formed of only, for example, Ti.

The first insulating layer 4 and the second insulating layer 7 each have a single layer structure containing, for example, $SiN_x$ (silicon nitride). The first insulating layer 4 and the second insulating layer 7 each have a thickness of, for example, 100 nm to 500 nm.

The semiconductor layer 5 is, for example, an amorphous silicon (a-Si) layer. The semiconductor layer 5 has a thickness of, for example, 50 nm to 300 nm. The semiconductor layer 5 may be a polycrystalline silicon layer or an oxide semiconductor layer.

The contact layer 6n is an a-Si layer including a high concentration ($n^+$) region. The contact layer 6n has a thickness of, for example, 10 nm to 100 nm. In the case where the semiconductor layer 5 is a polycrystalline silicon layer or an oxide semiconductor layer, the contact layer 6n may not need to be formed.

The pixel electrode, the third electrode 9a and the fourth electrode 9b are each formed of, for example, ITO. The pixel electrode, the third electrode 9a and the fourth electrode 9b each have a thickness of, for example, 50 nm to 200 nm.

The semiconductor device 100 may have a structure including a TFT substrate and a color filter provided thereon (referred to as a "CF-on-array structure") disclosed in, for example, Japanese Laid-Open Patent Publication No. 2001-330821.

Now, a method for producing the semiconductor device 100 in an embodiment according to the present invention will be described with reference to FIG. 3 through FIG. 7. FIG. 3 and FIG. 4 provide schematic plan views illustrating a method for producing the diode element 10A in an embodiment according to the present invention. FIG. 5 and FIG. 6 provide cross-sectional views taken along line I-I' and line II-II' in FIG. 3 and FIG. 4, respectively. FIG. 7 provides schematic cross-sectional views illustrating a method for producing the thin film transistor 50A. The diode element 50B is formed by substantially the same method as the diode element 50A and will not be described. Herein, the diode element 10A and the thin film transistor 50A are integrally formed.

First, the method for producing the diode element 10A will be described. The diode element 10A and the thin film transistor 50A described later are formed of a four-photomask process. According to the four-photomask process, one photomask is used to perform patterning for forming the source lines, source and drain electrodes and the semiconductor layer.

As shown in FIG. 3(a), FIG. 5(a) and FIG. 5(c), the first electrode 3 having a stacking structure including the bottom layer 3a of Ti and the top layer 3b of Cu is formed on an insulating substrate (e.g., glass substrate) 1 by a known method. The first electrode 3 is formed of a conductive film which is the same as that of a gate electrode 53 of the thin film transistor 50A described later. The bottom layer 3a has a thickness of, for example, 30 nm to 150 nm. The top layer 3b has a thickness of, for example, 200 nm to 500 nm. The top layer 3b may be formed of Al instead of Cu. The first electrode 3 may have a single layer structure of only, for example, Ti.

Next, as shown in FIG. 3(b), FIG. 5(b) and FIG. 5(d), the first insulating layer 4 containing, for example, $SiN_x$ is formed on the first electrode 3 by a known method. The first insulating layer 4 has a thickness of, for example, 100 nm to 500 nm.

Next, a semiconductor film 5' is formed on the first insulating layer 4 by a known method, and a contact film 6n' is formed on the semiconductor film 5' by a known method. The semiconductor film 5' is formed of, for example, a-Si. The contact film 6n' is formed of, for example, a-Si and includes a high concentration ($n^+$) region. The semiconductor film 5' is formed of a semiconductor film which is the same as that of the semiconductor layer of the thin film transistor 50A, and the contact film 6n' is formed of a contact film which is the same as that of the contact layer of the thin film transistor 50A. The semiconductor film 5' has a thickness of, for example, 50 nm to 300 nm. The contact film 6n' has a thickness of, for example, 10 nm to 100 nm.

Next, a conductive film 6 having a stacking structure including a bottom layer $6_1$ of Ti and a top layer $6_2$ of Cu is formed on the semiconductor film 5' by a known method. The conductive film 6 is formed of a conductive film which is the same as that of a source electrode 56 of the thin film transistor 50A described later. The top layer $6_2$ may be formed of, for example, Al instead of Cu. The conductive film 6 may have a single layer structure of only, for example, Ti. The bottom layer $6_1$ has a thickness of, for example, 30 nm to 150 nm. The top layer $6_2$ has a thickness of, for example, 200 nm to 500 nm.

Next, a photoresist layer 21 is formed on the conductive film 6 by halftone exposure by use of one photomask. A first part 21a of the photoresist layer 21 is formed so as to overlap a region which is to be the second electrode 6a described later. A part of the first part 21a of the photoresist layer 21 is formed so as to overlap a region which is to be the first region of the semiconductor layer 5. A second part 21b of the photoresist layer 21 is formed so as to overlap a region which is to be the channel region c of the semiconductor layer 5 of the diode element 10A. A third part 21c of the photoresist layer 21 is formed so as to overlap regions which are to be the source lines 16 described later. The first part 21a is formed separately from the third part 21c. The first part 21a and the third part 21c each have a thickness larger than that of the second part 21b. The first part 21a and the third part 21c each have a thickness of, for example, 1.5 μm to 2.5 μm. The second part 21b has a thickness of, for example, 0.5 μm to 1.2 μm. Since the photoresist layer 21 including parts having different thicknesses is formed by use of one photomask, the production cost is reduced.

Next, as shown in FIG. 4(a), FIG. 6(a) and FIG. 6(c), the conductive film 6 is patterned by wet etching. As a result, the source lines 16 and a metal layer 6a' are separately formed. The source lines 16 and the metal layer 6a' are not electrically connected to each other.

When a semiconductor layer is patterned by, for example, dry etching, the source lines 16 are charged. When the source lines 16 and the metal layer 6a' are connected to each other, all the source lines 16 in one diode ring coupling unit (hereinafter, referred to as a "source line bundle") are electrically connected together. When all the source lines 16 in the source line bundle are electrically connected together, the size of an area to be charged is increased, and thus the charge amount is increased. In addition, when, for example, adjacent source line bundles are charged to have different charge amounts, discharge is likely to occur between the adjacent source line bundles. When discharge occurs between the adjacent source line bundles, the source lines 16 themselves may be destroyed, for example. By contrast, in this embodiment, the source lines 16 and the metal layer 6a' are separately formed. Therefore, such discharge is unlikely to occur, and thus the source lines 16 are unlikely to be destroyed.

When the source lines 16 and the metal layer 6a' are connected to each other, all the source lines 16 in the source line bundle are electrically connected together. Therefore, inspections on the leak between adjacent source lines 16 and on disconnection of the source lines 16 cannot be performed. By contrast, in this embodiment, the source lines 16 and the metal layer 6a' are separately formed. Therefore, disconnection and leak inspections can be performed immediately after the formation of the source lines 16 and the metal layer 6a'. As compared with in the case where the source lines 16 and the metal layer 6a' are electrically connected to each other, the disconnection and leak inspections on the source lines 16 can be performed at an earlier stage and thus a fault of the source lines 16, if any, can be found earlier.

Next, the semiconductor film 5' and the contact film 6n' are patterned by dry etching to form the semiconductor layer 5 and the contact layer 6n.

Next, the second part 21b is removed by ashing. The thickness of the first part 21a and the third part 21c is decreased.

Next, as shown in FIG. 4(b), FIG. 6(b) and FIG. 6(d), a part of the metal layer 6a' which overlaps the region that is to be the channel region c of the semiconductor layer 5 of the diode element 10A is removed by wet etching to form the second electrode 6a. Then, a part of the contact layer 6n which overlaps the region that is to be the channel region c of the semiconductor layer 5, and a part of the region which is to be the channel region c of the semiconductor layer 5 of the diode element 10A, are removed by patterning. Then, the photoresist layer 21 is removed.

Next, the second insulating layer 7 containing, for example, $SiN_x$ is formed on the source lines 16 and the second electrode 6a by a known method. The second insulating layer 7 has a thickness of, for example, 100 nm to 500 nm.

Next, as shown in FIGS. 2(a) through 2(c), the third electrode 9a for electrically connecting the first electrode 3 and the second electrode 6a to each other, and the fourth electrode 9b for electrically connecting the first electrode 3 and the corresponding source line 16 to each other, are formed by a known method. The third electrode 9a and the fourth electrode 9b are formed of a conductive film which is the same as that of the pixel electrode described later, for example, ITO. The third electrode 9a and the fourth electrode 9b each have a thickness of, for example, 50 nm to 200 nm. The third electrode 9a and the fourth electrode 9b are separately formed in this example, but these electrodes do not absolutely need to be separated. When the third electrode 9a and the fourth electrode 9b are connected to each other, there is redundancy in connection of lines.

Next, the method for producing the thin film transistor 50A of the semiconductor device 100 will be described with reference to FIGS. 7(a) through 7(e).

As shown in FIG. 7(a), the gate electrode 53 having a stacking structure including a bottom layer 53a of Ti and a top layer 53b of Cu is formed on the insulating substrate (e.g., glass substrate) 1 by a known method. The gate electrode 53 has the same structure and the same thickness as those of the first electrode 3 described above.

Next, as shown in FIG. 7(b), a gate insulating layer containing, for example, $SiN_x$ is formed on the gate electrode 53 by a known method. The gate insulating layer 54 has the same structure and the same thickness as those of the first insulating layer 4 described above.

Next, a semiconductor film 55' is formed on the gate insulating layer 54 by a known method, and a contact film 56n' is formed on the semiconductor film 55' by a known method. The semiconductor film 55' has the same structure and the same thickness as those of the semiconductor film 5 described above. Similarly, the contact film 56n' has the same structure and the same thickness as those of the contact film 6n' described above.

Next, a conductive film 56' having a stacking structure including a bottom layer 56a' of Ti and a top layer 56b' of Cu is formed on the contact film 56' by a known method. The conductive film 56' has the same structure and the same thickness as those of the conductive film 6 described above.

Next, a photoresist layer 51 is formed on the conductive film 56' by halftone exposure by use of one photomask. A first part 51a of the photoresist layer 51 is formed so as to overlap regions which are to be a source region s' and a drain region d' (see FIG. 7(d)) of the semiconductor layer of the thin film transistor 50A. A second part 51b of the photoresist layer 51 is formed so as to overlap a region which is to be the channel region c' (see FIG. 7(d)) of the semiconductor layer of the thin film transistor 50A. The first part 51a has a thickness larger than that of the second part 51b. The first part 51a has a thickness of, for example, 1.5 μm to 2.5 μm. The second part 51b has a thickness of, for example, 0.5 μm to 1.2 μm. Since the photoresist layer 51 including parts having different thicknesses is formed by use of one photomask, the production cost is reduced.

Next, as shown in FIG. 7(c), the conductive film 56' is patterned by wet etching. As a result, a metal layer 56 is formed.

Next, the semiconductor film 55' and the contact film 56n' are patterned by dry etching to form the semiconductor layer 55 and the contact layer 56n.

Next, the second part 51b is removed by asking. The thickness of the first part 51a is decreased.

Next, as shown in FIG. 7(d), a part of the metal layer 56 which overlaps the region that is to be the channel region c' of the semiconductor layer of the thin film transistor 50A is removed by wet etching to form source and drain electrodes 56a. Then, a part of the contact layer 56n which overlaps the region that is to be the channel region c' of the semiconductor layer 55 of the thin film transistor 50A, and a part of the region which is to be the channel region c' of the semiconductor layer 55 of the thin film transistor 50A, are removed by patterning by dry etching. Then, the photoresist layer 51 is removed.

Next, an insulating layer 57 containing, for example, $SiN_x$ is formed on the source and drain electrodes 56 by a known method. The insulating layer 57 has the same structure and the same thickness as those of the second insulating layer 7. On the insulating layer 57, a photosensitive organic insulating layer may be formed.

Next, a pixel electrode (not shown) to be electrically connected to the drain electrode is formed by a known method. The pixel electrode is formed of, for example, ITO. The pixel electrode has the same structure and the same thickness as those of the third electrode 9a and the fourth electrode 9b.

As described above, according to a method for producing a semiconductor device in an embodiment according to the present invention, the metal layer and the source lines are separately formed. Therefore, even though a four-photomask process is used, the semiconductor device can be prevented from being damaged by electrostatic charges.

INDUSTRIAL APPLICABILITY

The present invention is widely applicable to circuit boards such as active matrix substrates; display devices such as liquid crystal display devices, organic electroluminescence (EL) display devices, inorganic electroluminescence display devices and the like; image pickup devices such as image sensors and the like; and semiconductor devices including thin film transistors such as image input devices, fingerprint reading devices and the like.

REFERENCE SIGNS LIST

1 Insulating substrate
10, 10A, 10B Diode element
14, 14(n), 14(n+1) Gate line
14t Gate terminal
16, 16(m), 16(m+1) Source line
16t Source terminal
20, 20A, 20B Shortcircuit ring
26 Connection region
40 Liquid crystal layer
50A Thin film transistor
100 Semiconductor device

The invention claimed is:

1. A semiconductor device, comprising:
an insulating substrate;
a plurality of source lines provided on the insulating substrate;
a thin film transistor electrically connected to each of the plurality of source lines;
a pixel electrode electrically connected to the thin film transistor; and
a diode element that electrically connects two source lines among the plurality of source lines;
wherein:
a semiconductor layer of the diode element includes a first region, a second region and a channel region located between the first region and the second region;
a connection region in which the source lines and the diode element are connected to each other includes:
a first electrode formed of a conductive film which is the same as that of a gate electrode of the thin film transistor;
a second electrode formed of a conductive film which is the same as that of the source lines; and
a third electrode and a fourth electrode formed of a conductive film which is the same as that of the pixel electrode;
a part of each source line is a source electrode of the thin film transistor, and the second electrode and the source lines are formed separately from each other;
the first electrode and the second electrode are electrically connected to each other via the third electrode; and
the first electrode and the corresponding source line are electrically connected to each other via the fourth electrode.

2. The semiconductor device of claim 1, wherein:
the first region is electrically connected to the second electrode corresponding to any one of the plurality of source electrodes; and the second region is electrically connected to the second electrode corresponding to another one of the plurality of source electrodes.

3. The semiconductor device of claim 1, wherein a plurality of the diodes elements are electrically connected parallel in opposite directions to each other.

4. The semiconductor device of claim 1, further comprising a color filter.

5. A method for producing a semiconductor device, the semiconductor device being of claim 1, comprising:
- step (A) of forming the first electrode on the insulating substrate;
- step (B) of forming an insulating layer on the first electrode;
- step (C) of forming the semiconductor layer on the insulating layer;
- step (D) of forming a metal layer and the source lines on the semiconductor layer such that the metal layer and the source lines are not electrically connected to each other;
- step (E) of removing a part of the metal layer which overlaps a region that is to be the channel region of the semiconductor layer of the diode element, thereby forming the second electrode; and
- step (F) of forming the third electrode that electrically connects the first electrode and the second electrode to each other, and forming the fourth electrode that electrically connects the first electrode and the corresponding source line to each other.

6. The method for producing the semiconductor device of claim 5, wherein the step (D) includes step (D1) of forming a photoresist layer on the metal layer such that a first part of the photoresist layer which overlaps the region that is to be the channel region of the diode element has a thickness smaller than the thickness of a second part of the photoresist layer which overlaps a region that is to be the first region of the diode element.

7. The method for producing the semiconductor device of claim 5, wherein the step (E) includes step (E1) of removing the first part.

* * * * *